United States Patent
Katada (10) Patent No.: US 6,433,721 B2
(45) Date of Patent: Aug. 13, 2002

(54) CURRENT SOURCE CELL ARRANGEMENT, METHOD OF SELECTING CURRENT SOURCE CELL AND CURRENT ADDITION TYPE DIGITAL-TO-ANALOG CONVERTER

(75) Inventor: Tomoyuki Katada, Kawasaki (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 09/886,689

(22) Filed: Jun. 21, 2001

(30) Foreign Application Priority Data

Jun. 23, 2000 (JP) ........................ 2000-189843

(51) Int. Cl.[7] ............................................. H03M 1/66
(52) U.S. Cl. ...................................................... 341/144
(58) Field of Search ................................. 341/144, 136, 341/153

(56) References Cited

U.S. PATENT DOCUMENTS 5,760,725 A    6/1998   Shinya et al.
5,949,362 A    9/1999   Tesch et al.
6,271,779 B1 * 2/2001   Yokomizo ................... 341/136

FOREIGN PATENT DOCUMENTS

| JP | 2-113630  | 4/1990  |
| JP | 5-191289  | 7/1993  |
| JP | 5-259915  | 10/1993 |
| JP | 8-330966  | 12/1996 |
| JP | 11-163728 | 6/1999  |

* cited by examiner

*Primary Examiner*—Brian Young
(74) *Attorney, Agent, or Firm*—Pearne & Gordon LLP (57) ABSTRACT

In a current source cell arrangement which comprises a plurality of current source cells (1) each having a predetermined current value, the current source cells being arranged in matrix; two or more of the current source cells in the current source cell matrix are combined to form constant current sources MCELL1–MCELL15 each having a predetermined current value; the current source cell matrix is divided into an A-block (2) and a B-block (3) arranged symmetrically with respect to a center of the matrix; and the constant current sources are formed by combining equal numbers of the current source cells selected in a row or column direction from each block.

12 Claims, 11 Drawing Sheets

A-BLOCK

| COLUMN NO. / ROW NO. | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|
| 1 | 1.00 | 1.03 | 1.06 | 1.09 | 1.12 | 1.15 | 1.18 | 1.21 | 1.24 | 1.27 | 1.30 | 1.33 | 1.36 | 1.39 | 1.42 |
| 2 | 1.02 | 1.05 | 1.08 | 1.11 | 1.14 | 1.17 | 1.20 | 1.23 | 1.26 | 1.29 | 1.32 | 1.35 | 1.38 | 1.41 | 1.44 |
| 3 | 1.04 | 1.07 | 1.10 | 1.13 | 1.16 | 1.19 | 1.22 | 1.25 | 1.28 | 1.31 | 1.34 | 1.37 | 1.40 | 1.43 | 1.46 |
| 4 | 1.06 | 1.09 | 1.12 | 1.15 | 1.18 | 1.21 | 1.24 | 1.27 | 1.30 | 1.33 | 1.36 | 1.39 | 1.42 | 1.45 | 1.48 |
| 5 | 1.08 | 1.11 | 1.14 | 1.17 | 1.20 | 1.23 | 1.26 | 1.29 | 1.32 | 1.35 | 1.38 | 1.41 | 1.44 | 1.47 | 1.50 |
| 6 | 1.10 | 1.13 | 1.16 | 1.19 | 1.22 | 1.25 | 1.28 | 1.31 | 1.34 | 1.37 | 1.40 | 1.43 | 1.46 | 1.49 | 1.52 |
| 7 | 1.12 | 1.15 | 1.18 | 1.21 | 1.24 | 1.27 | 1.30 | 1.33 | 1.36 | 1.39 | 1.42 | 1.45 | 1.48 | 1.51 | 1.54 |
| 8 | 1.14 | 1.17 | 1.20 | 1.23 | 1.26 | 1.29 | 1.32 | 1.35 | 1.38 | 1.41 | 1.44 | 1.47 | 1.50 | 1.53 | 1.56 |

B-BLOCK

| COLUMN NO. / ROW NO. | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|
| 1 | 1.16 | 1.19 | 1.22 | 1.25 | 1.28 | 1.31 | 1.34 | 1.37 | 1.40 | 1.43 | 1.46 | 1.49 | 1.52 | 1.55 | 1.58 |
| 2 | 1.18 | 1.21 | 1.24 | 1.27 | 1.30 | 1.33 | 1.36 | 1.39 | 1.42 | 1.45 | 1.48 | 1.51 | 1.54 | 1.57 | 1.60 |
| 3 | 1.20 | 1.23 | 1.26 | 1.29 | 1.32 | 1.35 | 1.38 | 1.41 | 1.44 | 1.47 | 1.50 | 1.53 | 1.56 | 1.59 | 1.62 |
| 4 | 1.22 | 1.25 | 1.28 | 1.31 | 1.34 | 1.37 | 1.40 | 1.43 | 1.46 | 1.49 | 1.52 | 1.55 | 1.58 | 1.61 | 1.64 |
| 5 | 1.24 | 1.27 | 1.30 | 1.33 | 1.36 | 1.39 | 1.42 | 1.45 | 1.48 | 1.51 | 1.54 | 1.57 | 1.60 | 1.63 | 1.66 |
| 6 | 1.26 | 1.29 | 1.32 | 1.35 | 1.38 | 1.41 | 1.44 | 1.47 | 1.50 | 1.53 | 1.56 | 1.59 | 1.62 | 1.65 | 1.68 |
| 7 | 1.28 | 1.31 | 1.34 | 1.37 | 1.40 | 1.43 | 1.46 | 1.49 | 1.52 | 1.55 | 1.58 | 1.61 | 1.64 | 1.67 | 1.70 |
| 8 | 1.30 | 1.33 | 1.36 | 1.39 | 1.42 | 1.45 | 1.48 | 1.51 | 1.54 | 1.57 | 1.60 | 1.63 | 1.66 | 1.69 | 1.72 |

| | MCELL1 | MCELL2 | MCELL3 | MCELL4 | MCELL5 | MCELL6 | MCELL7 | MCELL8 | MCELL9 | MCELL10 | MCELL11 | MCELL12 | MCELL13 | MCELL14 | MCELL15 |
|---|---|---|---|---|---|---|---|---|---|---|---|---|---|---|---|
| TOTAL CURRENT VALUE | 21.76 | 21.76 | 21.76 | 21.76 | 21.76 | 21.76 | 21.76 | 21.76 | 21.76 | 21.76 | 21.76 | 21.76 | 21.76 | 21.76 | 21.76 |

| COLUMN NO. / ROW NO. | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|
| 1 | 1.00 | 1.03 | 1.06 | 1.09 | 1.12 | 1.15 | 1.18 | 1.21 | 1.24 | 1.27 | 1.30 | 1.33 | 1.36 | 1.39 | 1.42 |
| 2 | 1.02 | 1.05 | 1.08 | 1.11 | 1.14 | 1.17 | 1.20 | 1.23 | 1.26 | 1.29 | 1.32 | 1.35 | 1.38 | 1.41 | 1.44 |
| 3 | 1.04 | 1.07 | 1.10 | 1.13 | 1.16 | 1.19 | 1.22 | 1.25 | 1.28 | 1.31 | 1.34 | 1.37 | 1.40 | 1.43 | 1.46 |
| 4 | 1.06 | 1.09 | 1.12 | 1.15 | 1.18 | 1.21 | 1.24 | 1.27 | 1.30 | 1.33 | 1.36 | 1.39 | 1.42 | 1.45 | 1.48 |
| 5 | 1.08 | 1.11 | 1.14 | 1.17 | 1.20 | 1.23 | 1.26 | 1.29 | 1.32 | 1.35 | 1.38 | 1.41 | 1.44 | 1.47 | 1.50 |
| 6 | 1.10 | 1.13 | 1.16 | 1.19 | 1.22 | 1.25 | 1.28 | 1.31 | 1.34 | 1.37 | 1.40 | 1.43 | 1.46 | 1.49 | 1.52 |
| 7 | 1.12 | 1.15 | 1.18 | 1.21 | 1.24 | 1.27 | 1.30 | 1.33 | 1.36 | 1.39 | 1.42 | 1.45 | 1.48 | 1.51 | 1.54 |
| 8 | 1.14 | 1.17 | 1.20 | 1.23 | 1.26 | 1.29 | 1.32 | 1.35 | 1.38 | 1.41 | 1.44 | 1.47 | 1.50 | 1.53 | 1.56 |
| 9 | 1.16 | 1.19 | 1.22 | 1.25 | 1.28 | 1.31 | 1.34 | 1.37 | 1.40 | 1.43 | 1.46 | 1.49 | 1.52 | 1.55 | 1.58 |
| 10 | 1.18 | 1.21 | 1.24 | 1.27 | 1.30 | 1.33 | 1.36 | 1.39 | 1.42 | 1.45 | 1.48 | 1.51 | 1.54 | 1.57 | 1.60 |
| 11 | 1.20 | 1.23 | 1.26 | 1.29 | 1.32 | 1.35 | 1.38 | 1.41 | 1.44 | 1.47 | 1.50 | 1.53 | 1.56 | 1.59 | 1.62 |
| 12 | 1.22 | 1.25 | 1.28 | 1.31 | 1.34 | 1.37 | 1.40 | 1.43 | 1.46 | 1.49 | 1.52 | 1.55 | 1.58 | 1.61 | 1.64 |
| 13 | 1.24 | 1.27 | 1.30 | 1.33 | 1.36 | 1.39 | 1.42 | 1.45 | 1.48 | 1.51 | 1.54 | 1.57 | 1.60 | 1.63 | 1.66 |
| 14 | 1.26 | 1.29 | 1.32 | 1.35 | 1.38 | 1.41 | 1.44 | 1.47 | 1.50 | 1.53 | 1.56 | 1.59 | 1.62 | 1.65 | 1.68 |
| 15 | 1.28 | 1.31 | 1.34 | 1.37 | 1.40 | 1.43 | 1.46 | 1.49 | 1.52 | 1.55 | 1.58 | 1.61 | 1.64 | 1.67 | 1.70 |
| 16 | 1.30 | 1.33 | 1.36 | 1.39 | 1.42 | 1.45 | 1.48 | 1.51 | 1.54 | 1.57 | 1.60 | 1.63 | 1.66 | 1.69 | 1.72 |

| | MCELL1 | MCELL2 | MCELL3 | MCELL4 | MCELL5 | MCELL6 | MCELL7 | MCELL8 | MCELL9 | MCELL10 | MCELL11 | MCELL12 | MCELL13 | MCELL14 | MCELL15 |
|---|---|---|---|---|---|---|---|---|---|---|---|---|---|---|---|
| TOTAL CURRENT VALUE | 18.40 | 18.88 | 19.36 | 19.84 | 20.32 | 20.80 | 21.28 | 21.76 | 22.24 | 22.72 | 23.20 | 23.68 | 24.16 | 24.64 | 25.12 |

CURRENT SOURCE CELL ARRANGEMENT, METHOD OF SELECTING CURRENT SOURCE CELL AND CURRENT ADDITION TYPE DIGITAL-TO-ANALOG CONVERTER

BACKGROUND OF THE INVENTION

The present invention relates to an arrangement of a plurality of current source cells forming an integrated circuit on a semiconductor printed circuit board and a method of selecting current source cells, and more specifically to a current source cell arrangement suited for minimizing signal distortions of a current addition type Digital-to-Analog (D/A) converter, a current source cell selection method and a current addition type D/A converter.

Many electronic devices such as cellular phones use a current addition type D/A converter that converts a digital signal into an analog signal. The current addition type D/A converter, if its differential non-linear error is large, distorts a converted analog signal.

Figure 10:
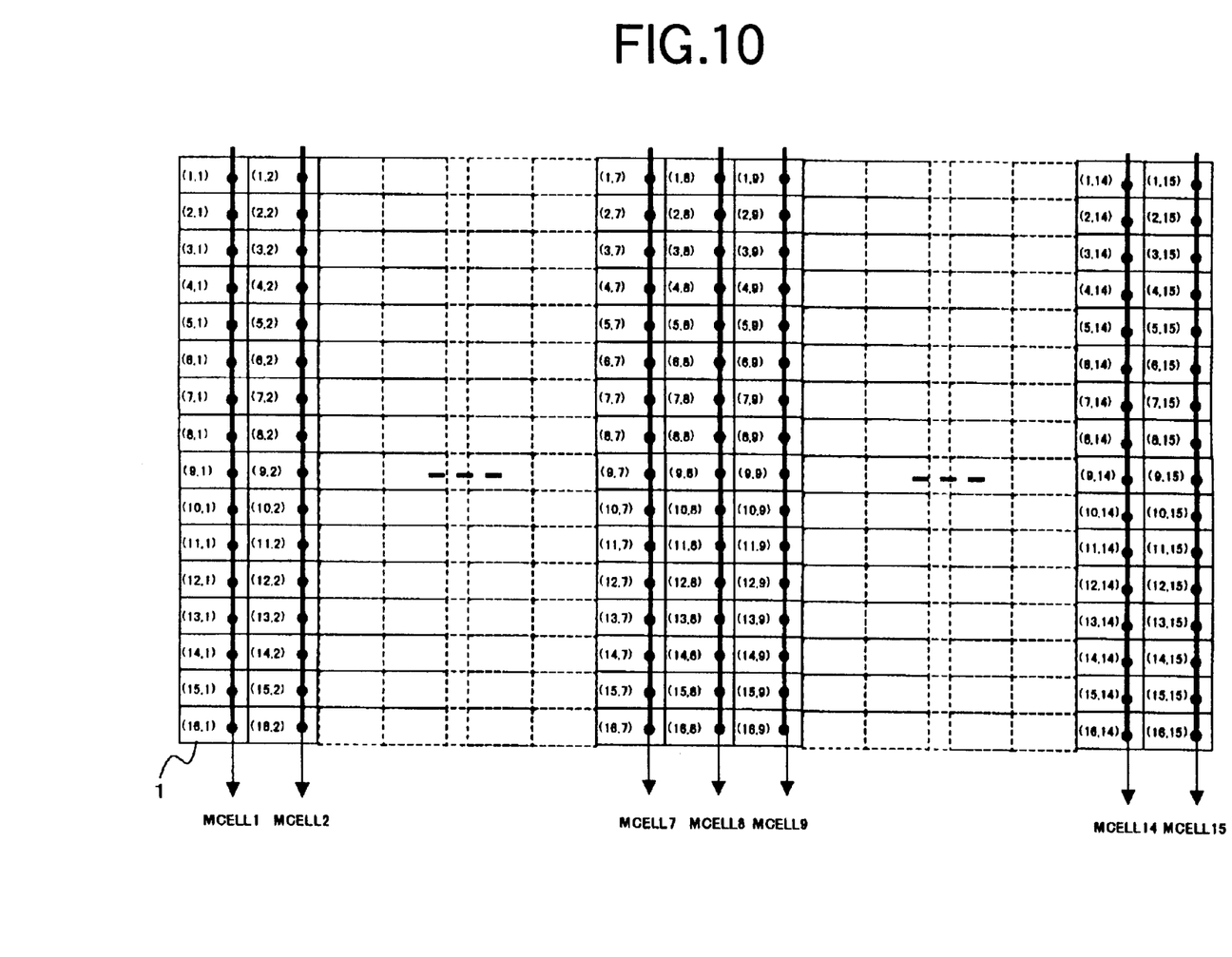
FIG. 10 is a diagram showing a conventional current source cell arrangement.

FIG. 10 is a layout diagram showing a conventional current source cell arrangement of the current addition type D/A converter. The current addition type D/A converter for mounting on LSIs is manufactured by arranging a large number of current source cells in matrix. FIG. 10 shows a configuration of the converter having an array of 240 current source cells 1 (16 rows×15 columns) arranged in 15 column units each consisting of 16 current source cells to represent higher 4-bit MSBs (most significant bits) of an 8-bit current addition type D/A converter.

In the following explanation of the current source cell matrix, a number "a" in matrix (a, b) represents a "row number" and a number "b" represents a "column number" unless otherwise specifically stated.

When a conventional current source cell matrix of such a configuration is to be operated as a D/A converter, the following arrangements are made. For example, if one unit of the MSB cell is to be represented by a current value of 16 current source cells, "2" units of MSBs can be represented by selecting 32 current source cells. Similarly, "N" MSBs can be represented by selecting 16×N current source cells.

At this time, according to the conventional layout of the current source cells, a vertical column is selected to electrically connect the 16 current source cells. For example, (1, 1) to (16, 1) are selected to represent one unit of MSB and the total current value of that one unit is used as a signal output for MCELL1. Next, (1, 2) to (16, 2) are selected to represent one unit of MSB and the total current value of that one unit is used as a signal output for MCELL2. The similar process is carried out until the current source cells (1, 15) to (16, 15) are connected vertically, thus producing signals MCELL1 to MCELL15. In this way, to simplify the connection of one unit of MSB, the current source cells to be summed up are arranged in one direction (column direction).

The layout of the current source cells 1 shown in FIG. 10 are assumed to have the same capacities. If there are variations in capability among the current source cells, the capability variations are reflected on the output signals from MCELL1–15, distorting the output signals from the D/A converter.

The capability variations of the current source cells are those with a certain tendency, rather than random variations. This is considered to result from the LSI manufacturing process. When for example the weight of the current capability of the current source cell (1, 1) at the upper left corner is "1", the current capability increases at a rate of 2% in the vertical direction and at a rate of 3% in the lateral direction as indicated by figures in the cells of FIG. 11, exhibiting a certain tendency of variations.

Figure 11:
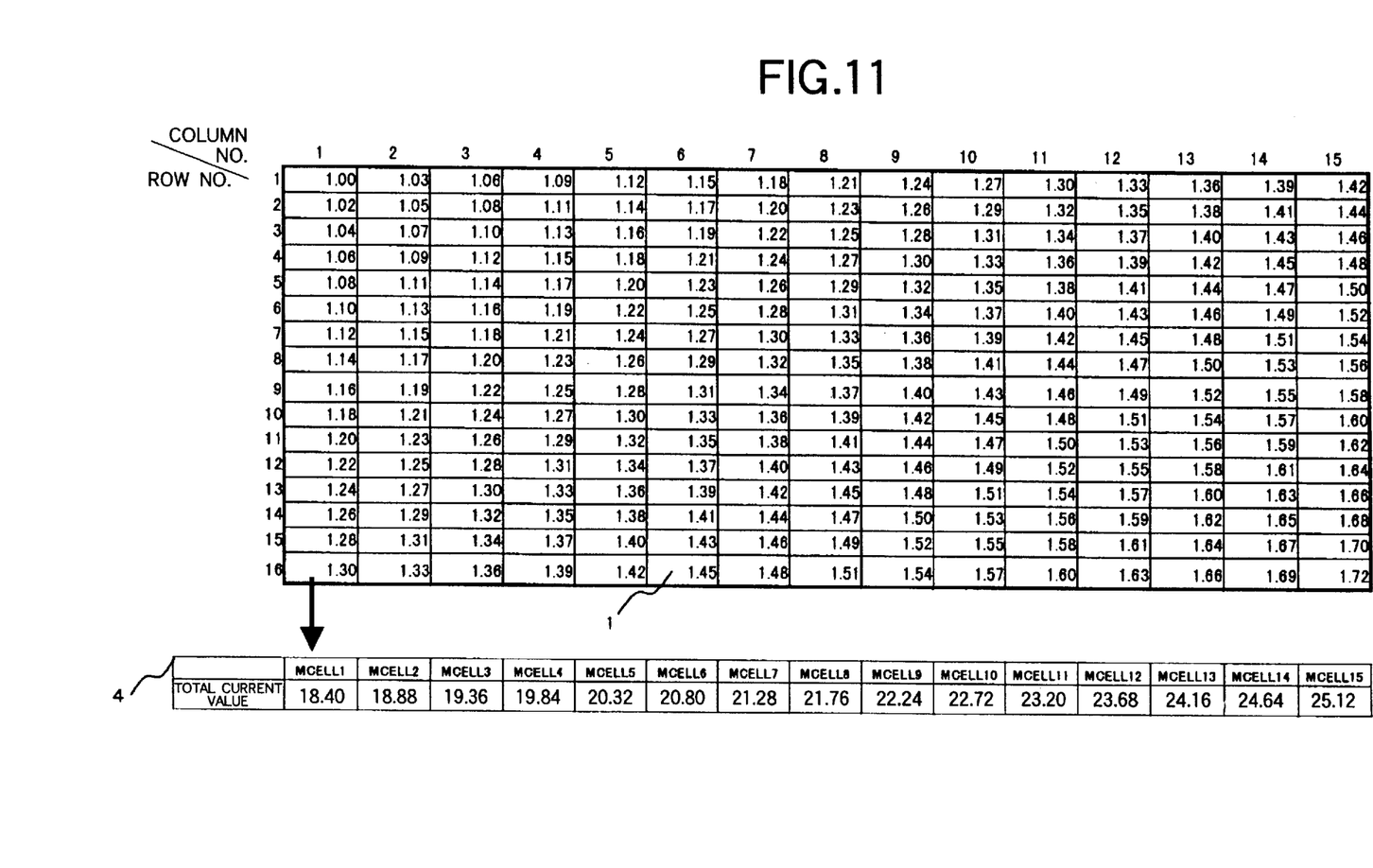
FIG. 11 is a diagram showing output current values of current source cells and output current values of MSB cells when there are process variations among the current source cells of FIG. 10.

In such a current source cell matrix, when the outputs of the 16 vertically arranged current source cells are electrically connected, their total current value is "18.4" in the smallest MCELL1 and "25.12" in the largest MCELL15 for each MSB cell 4.

Due to the process variations that occur when the D/A converter is manufactured in the form of LSI, the current values of constitutional current source cells differ greatly between the ends of the current source cell matrix, making it impossible to secure linearity. Particularly in the current addition type D/A converter that controls the output value by the current value, a differential non-linearity (DNL) error and an integral non-linearity (INL) error, measures of its linearity characteristics, deteriorate.

Although in the above conventional example a D/A converter has been described, the same problem occurs also when a plurality of constant current sources are manufactured on semiconductor IC circuits. When constant current sources are provided on semiconductor IC circuits, because a required output current cannot be produced by one current source cell alone, outputs of a plurality of current source cells are parallelly connected to function as a constant current source with a predetermined output. However, if a large number of current source cells provided as shown in FIG. 10 are divided into groups each consisting of a predetermined number of cells and, in each group, the output currents of the cells are added up to manufacture a plurality of constant current sources with the same outputs, it is difficult to make the outputs of these constant current sources equal, resulting in variations.

SUMMARY OF THE INVENTION

The present invention has been accomplished to solve the problems described above and provides a current source cell arrangement, a current source cell selection method and a current addition type D/A converter, in which current value errors in the current sources due to process variations are reduced by improving the layout of the current source cells to improve a linearity and therefore characteristic of the current sources.

To solve the above problem, this invention according to the first aspect of the invention provides a current source cell arrangement which comprises: a plurality of current source cells each having a predetermined current value, the current source cells being arranged in matrix; wherein two or more of the current source cells in the current source cell matrix are combined to form constant current sources each having a predetermined current value; wherein the current source cell matrix is divided into a plurality of blocks arranged symmetrically with respect to a center of the matrix; wherein the constant current sources are formed by combining equal numbers of the current source cells selected in a row or column direction from each block.

According to the second aspect of the invention, the invention provides a current source cell arrangement in which the current source cell matrix is divided point-symmetrically with respect to a center of the matrix.

According to the third aspect of the invention, the invention provides a current source cell arrangement in which the current source cell matrix is divided line-symmetrically with respect to a center of the matrix.

According to the fourth aspect of the invention, the invention provides a current source cell arrangement in which the current source cell matrix is divided radially with respect to a center of the matrix.

According to the fifth aspect of the invention, the invention provides a current source cell selection method for forming constant current sources each having a predetermined current value by combining two or more of a plurality of current source cells, wherein the plurality of the current source cells each having a predetermined current value are arranged in matrix, the current source cell selection method comprising the steps of: dividing the current source cell matrix into a plurality of blocks arranged symmetrically with respect to a center of the matrix; and selecting an equal number of the current source cells in a row or column direction from each of the divided blocks and combining them to form the constant current sources.

According to the sixth aspect of the invention, the invention provides a current source cell selection method in which the current source cell matrix is divided point-symmetrically with respect to a center of the matrix.

According to the seventh aspect of the invention, the invention provides a current source cell selection method in which the current source cell matrix is divided line-symmetrically with respect to a center of the matrix.

According to the eighth aspect of the invention, the invention provides a current source cell selection method in which the current source cell matrix is divided radially with respect to a center of the matrix.

According to the ninth aspect of the invention, the invention provides a D/A converter which has the current source cell matrix based on the current source cell arrangement according to any one of claims 1 to 4 or the current source cell matrix based on the current source cell selection method according to any one of claims 5 to 8, wherein the constant current sources constitute MSB units representing higher order bits of a digital input, and current values of a plurality of the constant current sources selected according to a decoded value of the digital input are added up to produce an analog output.

According to tenth, the invention provides a D/A converter in which LSB units representing lower order bits of the digital inputs are each formed of at least one of the current source cells.

According to the current source cell arrangement and the current source cell selection method of this invention, if there are capability variations among the current source cells due to manufacturing process variations, these variations can be canceled because the capabilities of the current source cells located at symmetric positions are summed up. Hence, the outputs of the constant current sources are made equal with high precision.

Further, when the current addition type D/A converter is formed by using the constant current sources described above, the degradation of the differential non-linearity (DNL) error and integral non-linearity (INL) error, both representing linearity characteristics, can be reduced, thus realizing a high-precision D/A conversion performance.

DETAILED DESCRIPTION OF THE PREFERRED EMBODIMENTS

Now, embodiments of the present invention will be described by referring to the accompanying drawings.

Embodiment 1

Figure 1:
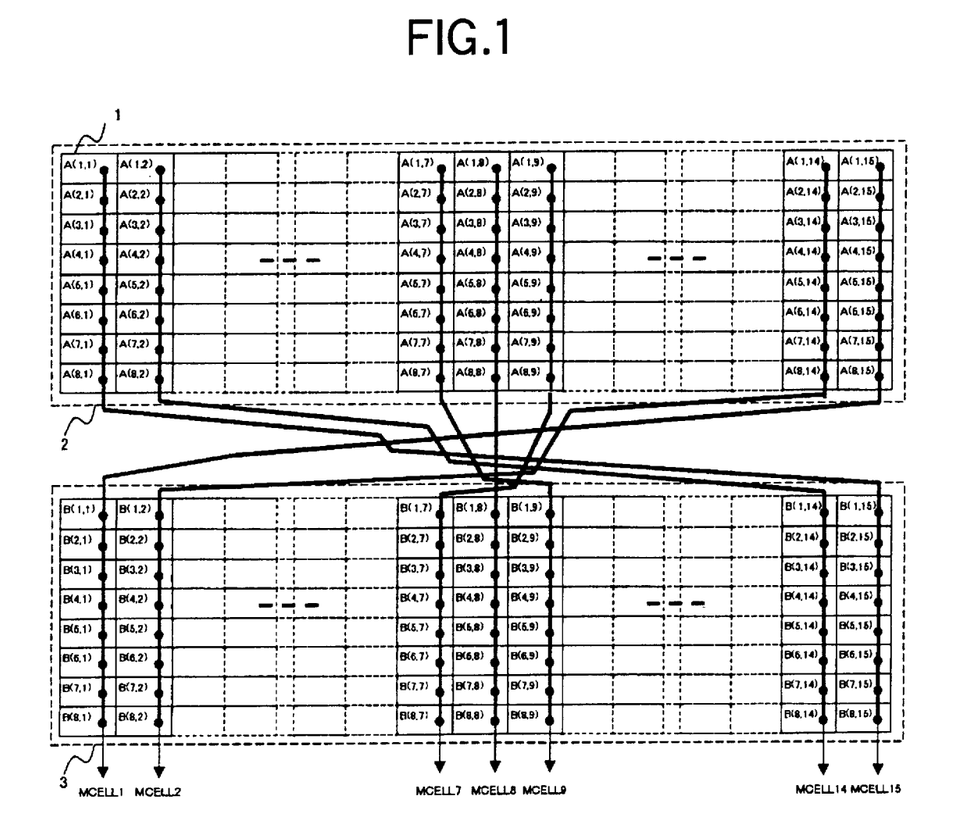
FIG. 1 is a diagram showing a current source cell arrangement according to the first embodiment of the invention.

FIG. 1 is a diagram showing a current source cell arrangement according to the first embodiment of the invention. This is an arrangement diagram of a current source cell matrix that, for example, represents higher 4 bits of an 8-bit current addition type D/A converter. In FIG. 1, two blocks of current source cells, i.e., an A-block 2 made up of 120 current source cells 1 arranged in 8 rows and 15 columns and a B-block 3 made up of 120 current source cells 1 arranged in 8 rows and 15 columns, are provided for a total of 240 current source cells arranged in 16 rows and 15 columns.

Each of the current source cells 1 is attached with a suffix A indicating that the cell is in the upper A-block or a suffix B indicating that the cell is in the lower B-block. The first number in the suffix represents a row number and the second number a column number, as described earlier.

Suppose that "1" MSB is represented by the current value of 16 current source cells. Then, "2" MSBs are represented by selecting 32 current source cells. Similarly, "N" MSBs are represented by selecting 16×"N" current source cells. With the current source cell matrix arrangement method in which the current source cells are divided into two blocks, an upper A-block 2 and a lower B-block 3, one unit of MSB is formed by selecting and electrically connecting two columns, one each from the upper and lower block, which are symmetric with respect to a matrix center.

For example, a column of eight current source cells A(1, 1) to A(8, 1) and a column of eight current source cells B(1, 15) to B(8, 15) selected from the B-block and symmetric to the first column in the A-block with respect to the matrix center are connected together. These 16 current source cells are used as one unit of MSB and the total of output currents of these cells is output as MCELL15.

Likewise, the outputs of 16 current source cells, the total of A(1, 2)–A(8, 2) and B(1, 14)–B(8, 14), are electrically connected to form one unit of MSB and output as MCELL14. The similar connecting procedure is repeated. With final 16 current source cells A(1, 15)–A(8, 15) and B(1, 1)–B(8, 1) electrically connected, a total of 15 MSB units are formed, producing outputs MCELL1–MCELL15. Here, 4-bit data is decoded into a decimal number and the same number of MSB units, which were formed by the above connection method, as the decoded decimal value are selected to obtain from the current source cell matrix a current value corresponding to the 4-bit data.

Figure 2:
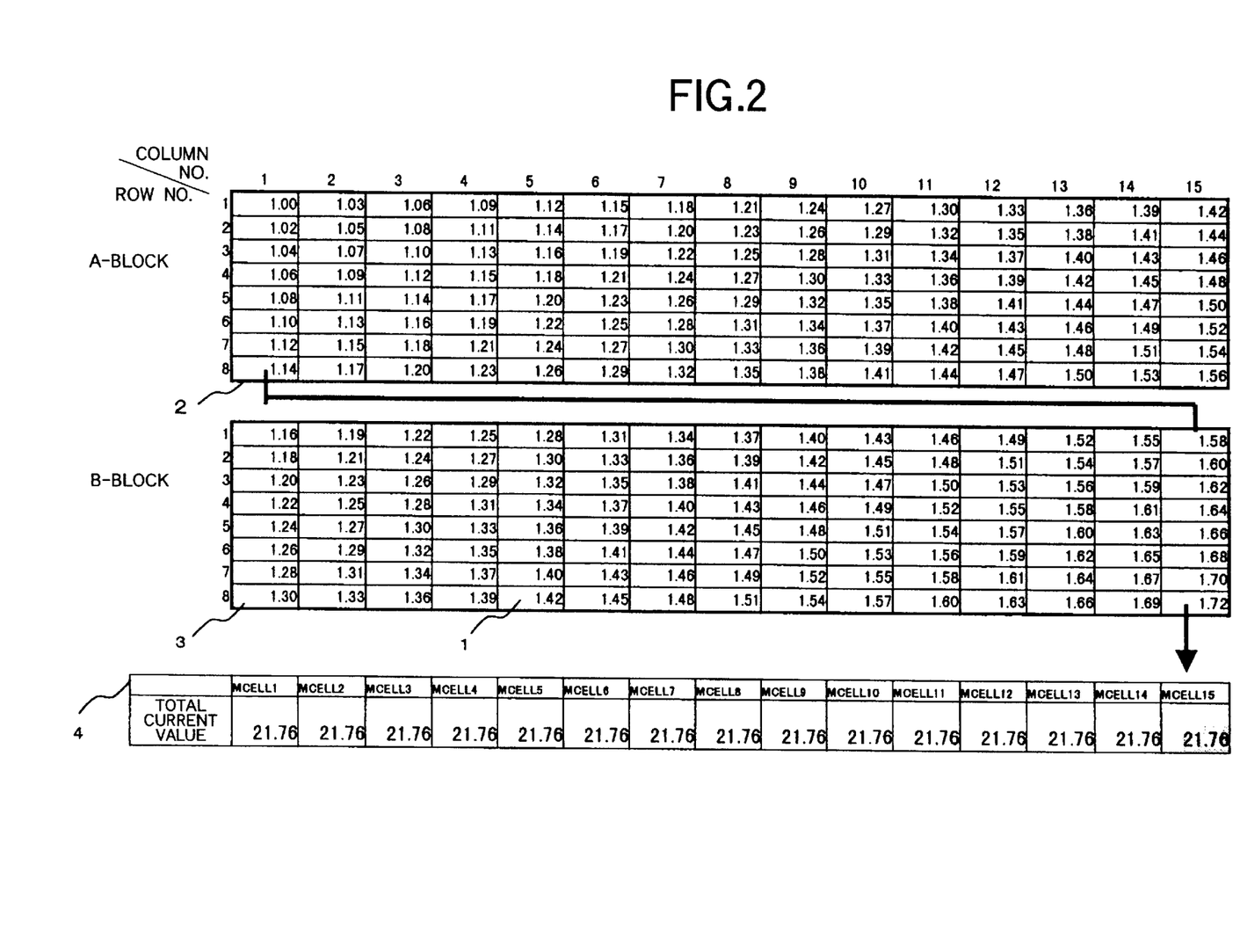
FIG. 2 is a diagram showing output current values of current source cells and output current values of MSB cells when there are process variations with a certain inclination among the current source cells of FIG. 1.

FIG. 2 is a diagram showing how the manufacturing process variations are canceled in the arrangement of current source cell matrix shown in FIG. 1. As in the case of FIG. 11, it is assumed that the weight of the current source cell at the upper left corner is taken as "1" and that there are process variations that cause the current capability to increase at a rate of 2% in the vertical direction (columns) and at a rate of 3% in the horizontal direction (rows). The current of each current source cell in this case is indicated in each cell. The line connecting the A-block 2 and the B-block 3 represents the state when MCELL15 is selected and the total of currents of the selected current source cells is shown in the associated CELL in the MCELL table 4.

Sets of current source cells in the A-block 2 and the B-block 3 that are point-symmetric to each other are chosen and connected to make the variations in the vertical direction equal among different MSB units, thus canceling not only the vertical variations (columns) but also horizontal variations (rows). Hence, as shown in the MCELL table 4, the values of MCELL1–MCELL15 are the same at "21.76".

In the D/A converter, if the output corresponding to a decimal number "N", which is decoded from MSB, is not N times the output corresponding to a decimal number "1", a signal rejection may occur. In the conventional example shown in FIG. 11, MCELL1+MCELL2+ . . . +MCELL"N" which is the output of a decimal number "N" is not equal to "N" times the MCELL1 which is the output of a decimal number "1". This is due to the manufacturing process variations. In the first embodiment, however, the total is equal to N times the MCELL unit with high precision, thus maintaining the linearity.

As described above, one or several kinds of two or more current source cells are arranged in a matrix array consisting of a plurality of rows and columns, and outputs of a predetermined number of current source cells are connected together to form an MSB unit which represents higher order bits. A plurality of such MSB units are provided. Further, the current source cell matrix is divided into upper and lower halves; two columns of current source cells that are point-symmetric with respect to the center of the matrix are selected, one each from the upper and lower block; and the selected columns of the current source cells are electrically connected together to form the MSB unit. With this arrangement, even when the current values of individual current source cells vary with a certain inclination, the vertically inclined variations (columns) can be canceled by selecting one current source cell from each row and the horizontally inclined variations (rows) can be canceled by selecting columns of current source cells, one from the upper block and one from the lower block, which are point-symmetric with respect to the matrix center.

That is, selecting one current source cell from each row makes the vertical variations (columns) equal among different MSB units, canceling the vertical variations. The horizontal variations (rows) can be canceled by selecting columns of current source cells that are symmetric with respect to the matrix center. In this way, an excellent arrangement of the current source cells that reduces influences of process variations can be realized.

Although in the first embodiment the current source cell matrix is divided in two in the row direction (i.e., diving 16 rows in each column into two blocks of 8 rows), the similar effect can also be obtained by dividing the matrix in two in the column direction (i.e., dividing 16 columns in each row into two blocks of 8 columns). Further, although the matrix is divided in two, it is possible to divide it into n times 2 subdivisions and make similar combinations and still produce the similar effect. While in the first embodiment columns of current source cells are selected which are symmetric with respect to the center of the current source cell matrix, there is no problem if unused, nonactive current source cell columns are arranged on the left or right or both sides of the current source cell matrix, or if the center of the active current source cell columns are shifted to a selected point and symmetric selection is made of these columns. Furthermore, the unused current source cell columns may be placed at the center and still the similar effects can be obtained.

Embodiment 2

Figure 3:
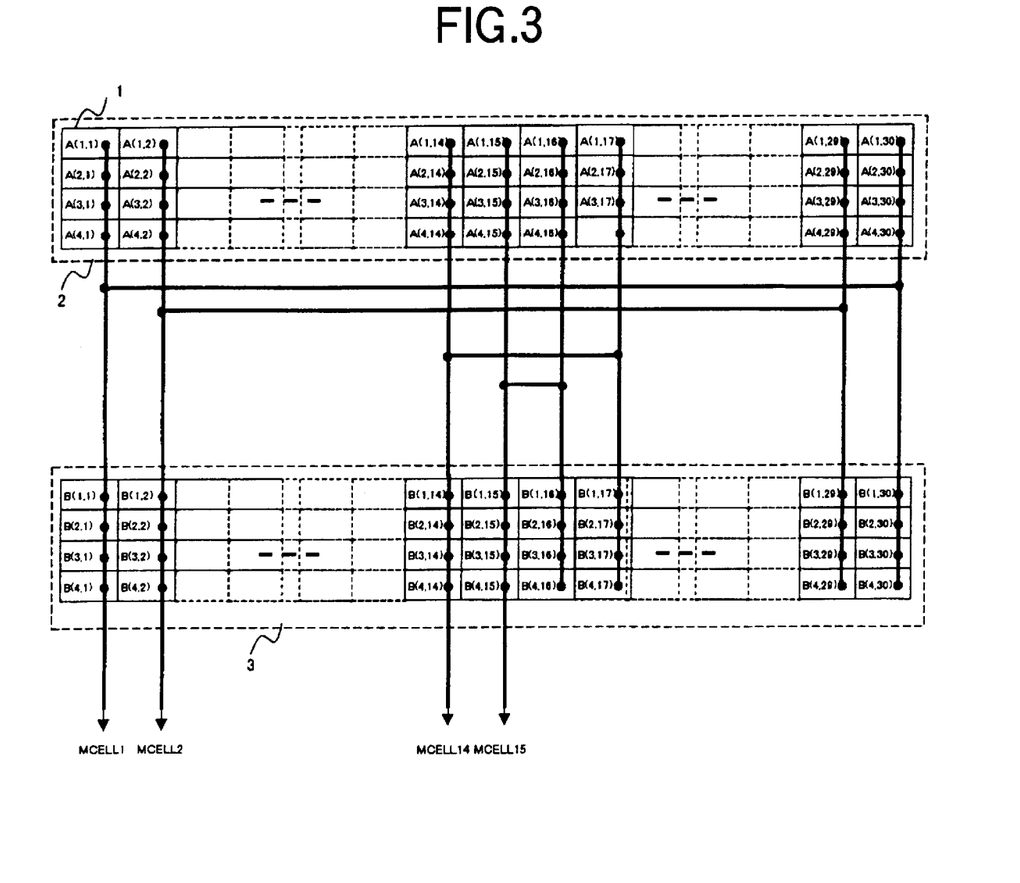
FIG. 3 is a diagram showing a current source cell arrangement according to the second embodiment of the invention.

FIG. 3 is a diagram showing an arrangement of current source cells according to the second embodiment of this invention. In the second embodiment, two blocks—A-block 2 and B-block 3—each made up of current source cells 1 arranged in four rows and 30 columns, are used to produce a required current. That is, in the current source cell matrix divided in upper and lower halves, two columns that are axially symmetric with respect to the center of the matrix are selected, one each from the upper and lower block. The selected two columns are electrically connected to form one MSB unit.

For example, in the A-block, a total of eight current source cells A(1, 1)–A(4, 1) and axially symmetric A(1, 30)–A(4, 30) are selected. Similarly, in the B-block, a total of eight current source cells B(1, 1)–B(4, 1) and axially symmetric B(1, 30)–B(4, 30) are selected. The 16 current source cells thus selected are electrically connected to form one MSB cell and produce an output of MCELL1.

Similarly, a total of 16 current source cells A(1, 2)–A(4, 2), A(1, 29)–A(4, 29), B(1, 2)–B(4, 2) and B(1, 29)–B(4, 29) are electrically connected to form one MSB unit and produce an output of MCELL2. The similar connecting procedure is repeated. With final 16 current source cells A(1, 15)–A(4, 15), A(1, 16)–A(4, 16), B(1, 15) –B(4, 15) and B(1, 16)–B(4, 16) electrically connected, a total of 15 MSB units are formed, producing outputs MCELL1–MCELL15.

Figure 4:
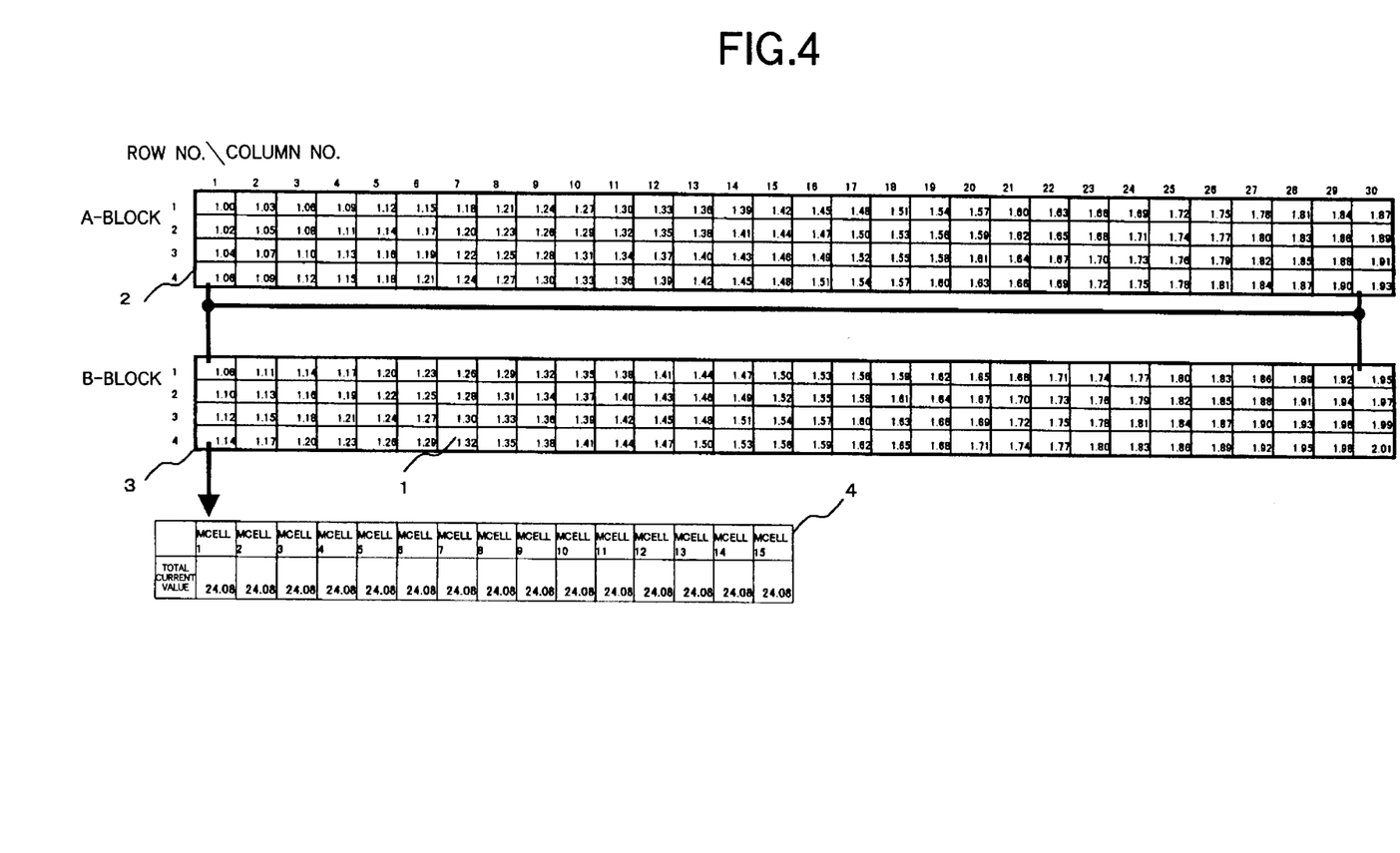
FIG. 4 is a diagram showing output current values of current source cells and output current values of MSB cells when there are process variations with a certain inclination among the current source cells of FIG. 3.

FIG. 4 shows current capability values for individual current source cells and output values for individual MSB units when there are 2% manufacturing process variations (columns) in a vertical direction and 3% variations (rows) in a horizontal direction. In the second embodiment, too, if there are variations in the current source cell capability due to the manufacturing process, they can be canceled to make the outputs of different MSB terminals equal with high accuracy, as in the first embodiment.

As described above, in the current source cell matrix, the columns in the matrix are divided into two upper and lower blocks; two columns that are axially symmetric with respect to the center of columns are selected, one each from the upper and lower block; the selected columns are electrically connected to form one MSB unit; and a plurality of such MSB units are provided. If the current values of individual current source cells vary with a certain inclination, it is possible to cancel the vertically inclined variations (columns) by selecting one current source cell from each row and also cancel the horizontally inclined variations (rows) by selecting two columns, one each from the upper and lower block, which are axially symmetric with respect to the matrix center. That is, the vertical variations (columns) can be canceled by making individual MSB values equal, and the horizontal variations (rows) can be canceled by selecting those columns that are axially symmetric with respect to the center of the matrix, thus achieving an excellent current source cell arrangement that can reduce influences of process variations.

While in the second embodiment, too, the matrix is divided in two in the row direction, it is possible, as in the first embodiment, to divide the matrix in the column direction and produce the similar effect. Further, the similar effect can also be obtained by dividing the matrix in n times 2 subdivisions and forming the similar combinations. Further, although the columns located at positions point-symmetric to each other with respect to the center of the current source cell matrix are selected, it is possible to arrange the unused current source cell columns on the left or right or both sides of the current source cell matrix, or to shift the center of the current source cell columns being used to a selected point and pick symmetric columns. It is also possible to arrange the unused current source cell columns at the center and still produce the similar effect.

Further, although in the second embodiment the pair of current source cell columns selected in the A-block and the pair of current source cell columns selected in the B-block are equal, the column pairs selected in the A-block and B-block may be arbitrary. Although two columns are selected from each block, a plurality of columns that are symmetric with respect to the center of the matrix may be chosen at the same time to produce the similar effect.

Embodiment 3

Figure 5:
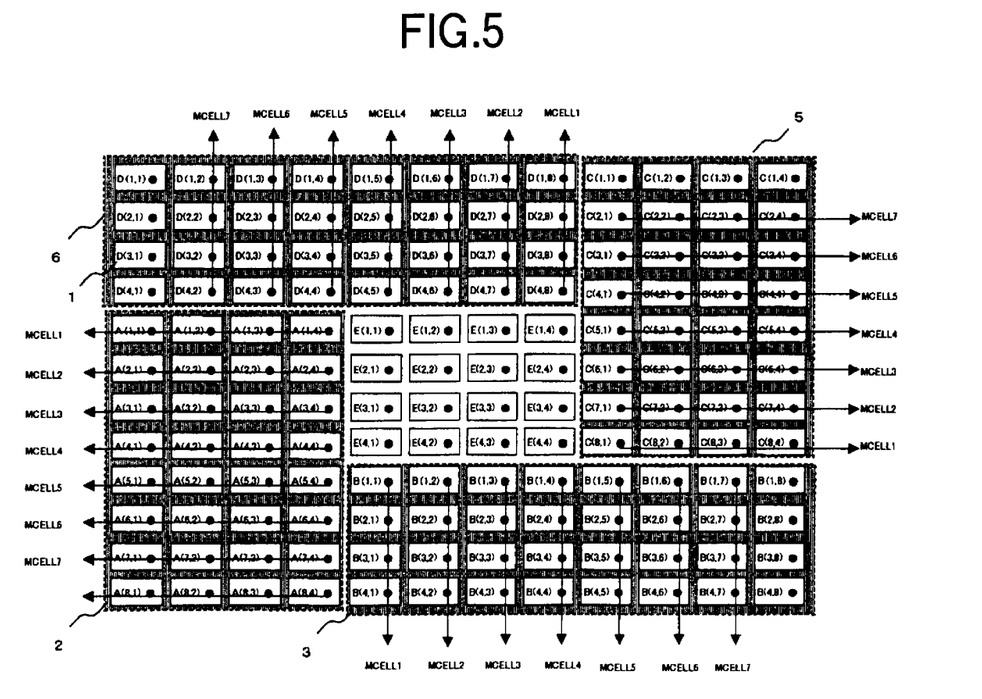
FIG. 5 is a diagram showing a current source cell arrangement according to the third embodiment of the invention.

FIG. 5 shows an arrangement of current source cells according to the third embodiment of the invention. In the third embodiment, the entire current source cell matrix uses two blocks consisting of 8 rows and 4 columns and two blocks consisting of 4 rows and 8 columns, with these four blocks arranged around a block of nonactive (not used) current source cells at the center that are arrayed in 4 rows and 4 columns. In the example shown, four blocks are arranged around the unused 4-row-by-4-column block in a doughnut (ring) configuration in the order of an 8-row-by-4-column A-block 2, a 4-row-by-8-column B-block 3, an 8-row-by-4-column C-block 5, and a 4-row-by-8-column D-block 6.

For example, in the A-block four current source cells are taken beginning with the top row; in the B-block four current source cells are taken beginning with the left column; in the C-block four current source cells are taken beginning with the bottom row; and in the D-block four current source cells are taken beginning with the right column. These 16 current source cell outputs are electrically connected parallelly.

That is, a total of 16 current source cells A(1, 1)–A(1, 4), B(1, 1)–B(4, 1), C(8, 1)–C(8, 4) and D(1, 8)–B(4, 8) are selected and electrically connected to produce an output MCELL1 as an MSB unit. Similarly, a total of 16 current source cells A(2, 1)–A(2, 4), B(1, 2)–B(4, 2), C(7, 1)–C(7, 4) and D(1, 7)–D(4, 7) are selected and electrically connected to produce an output MCELL2 as an MSB unit. The similar connecting procedure is repeated. After a total of 16 current source cells A(7, 1)–A(7, 4), B(1, 7)–B(4, 7), C(2, 1)–C(2, 4) and D(1, 2)–D(4, 2) are selected and electrically connected, a total of seven MSB units are formed.

In the third embodiment, MCELL1–MCELL7 are obtained. Then, 3-bit data is decoded into a decimal number, and selecting the same number of MSB units, which are formed by the above connection method, as the decoded value can produce from the current source cell matrix an amount of current corresponding to the 3-bit data.

Figure 6:
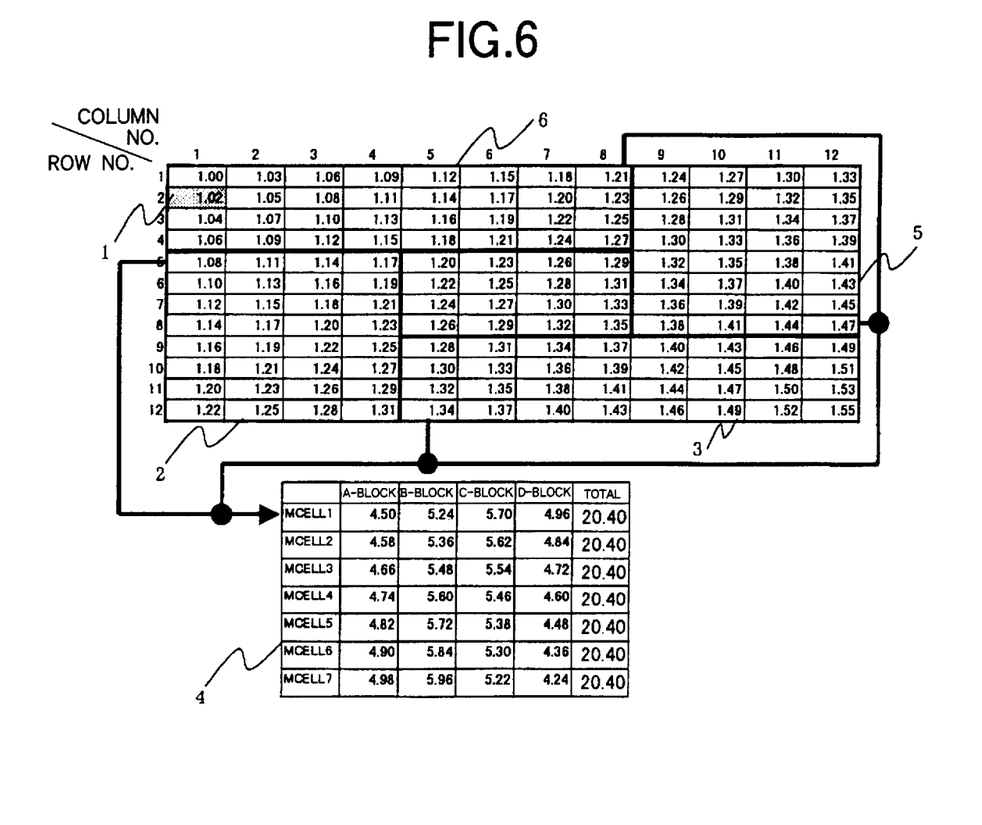
FIG. 6 is a diagram showing output current values of current source cells and output current values of MSB cells when there are process variations with a certain inclination among the current source cells of FIG. 5.

FIG. 6 shows how in-plane variations in the current value are canceled in the arrangement of current source cells according to the third embodiment of the invention. The diagram shows current values of individual current source cells by assuming that the weight of a current source cell at the upper left corner is "1" and that the current capability of these current source cells increases at a rate of 2% in the vertical direction (column direction) and at a rate of 3% in the horizontal direction (row direction) as described above. As in FIG. 5, reference number 2 represents an A-block, 3 a B-block, 4 total currents of MSB cells, 5 a C-block and 6 a D-block, respectively.

The lines connecting the four blocks, A, B, C, D represent a case when one unit of MSB cell is selected. In this case MCELL1 is selected. Current totals of the selected current source cells are shown in the table 4. By selecting four current source cells from each block successively and selecting columns of current source cells that are symmetric with respect to the matrix center, the vertical variations (columns) and the horizontal variations (rows) are canceled. Hence, even if there are current capability variations among the current source cells, the MSB units are made equal.

As described above, one or several kinds of two or more current source cells are arranged in a plurality of rows and columns to form a current source cell matrix; four such current source cell matrices are arranged in a doughnut configuration; and outputs of a predetermined number of current source cells are connected to form an MSB cell unit representing higher order bits. When forming a plurality of MSB cell units, one column of current source cells is selected in a predetermined direction from each of the four current source cell matrices. Each MSB cell is formed by successively selecting one column from each of the four current source cell matrices to connect a predetermined total number of current source cells, thereby canceling the variations (columns) in the vertical direction and (rows) in the horizontal direction.

That is, a predetermined number of current source cells are selected in the same manner from the four current source cell matrices (blocks) arranged around a center in a doughnut configuration. Thus, it is possible to realize an excellent arrangement of current source cells that can make uniform selection of columns from among the current source cell matrices and cancel vertical and horizontal variations.

In the third embodiment, columns or rows have been described to be selected radially in the same direction with respect to the center of the doughnut from each of the four blocks. The order of selection may be arbitrary as long as the selection position in each block is identical. Although one column or row has been described to be selected from the current source cell matrix in each block, a plurality of columns or rows may be selected. There is no problem if unused current source cell columns or current source cell rows are placed at the periphery of or at the center of the current source cell matrix in each block as long as the same arrangement method is adopted for the four current source cell matrices.

Figure 7:
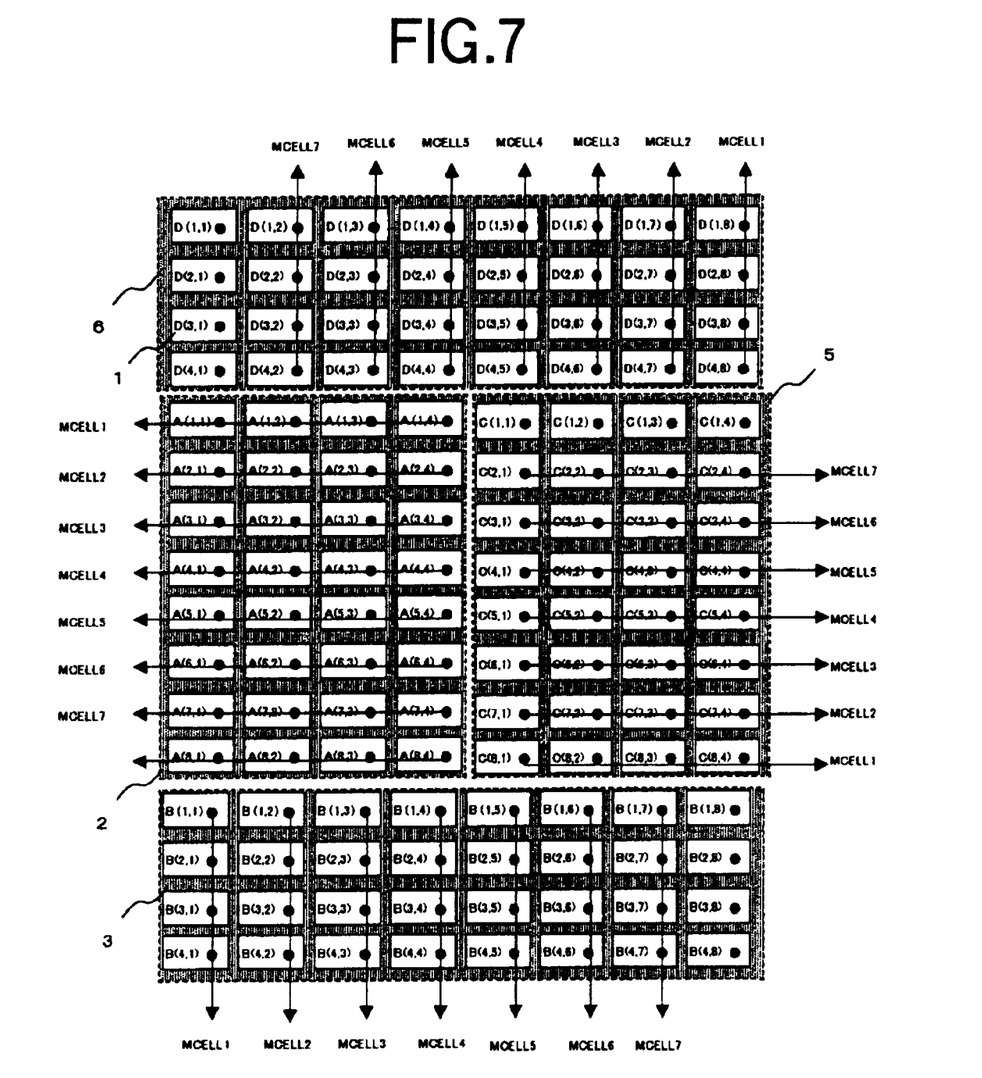
FIG. 7 is a diagram showing a variation of the current source cell arrangement of FIG. 5.

Further, although the above explanation concerns the current source cell matrix consisting of four blocks, the similar effect can be obtained if 4×n (n is a natural number) current source cell matrices are used. While the current source cell matrices are arranged in a doughnut configuration and the central block four rows high by 4 columns wide is made up of nonactive current source cells, this nonactive block may be omitted. There is no problem at all if this nonactive block is omitted and four blocks are arranged adjacent to each other in a ring configuration in the radial direction with respect to the center of the matrix, as shown in FIG. 7. The blocks A, B, C, D in FIG. 7 have the same constitutional elements as those in FIG. 5.

Embodiment 4

Figure 8:
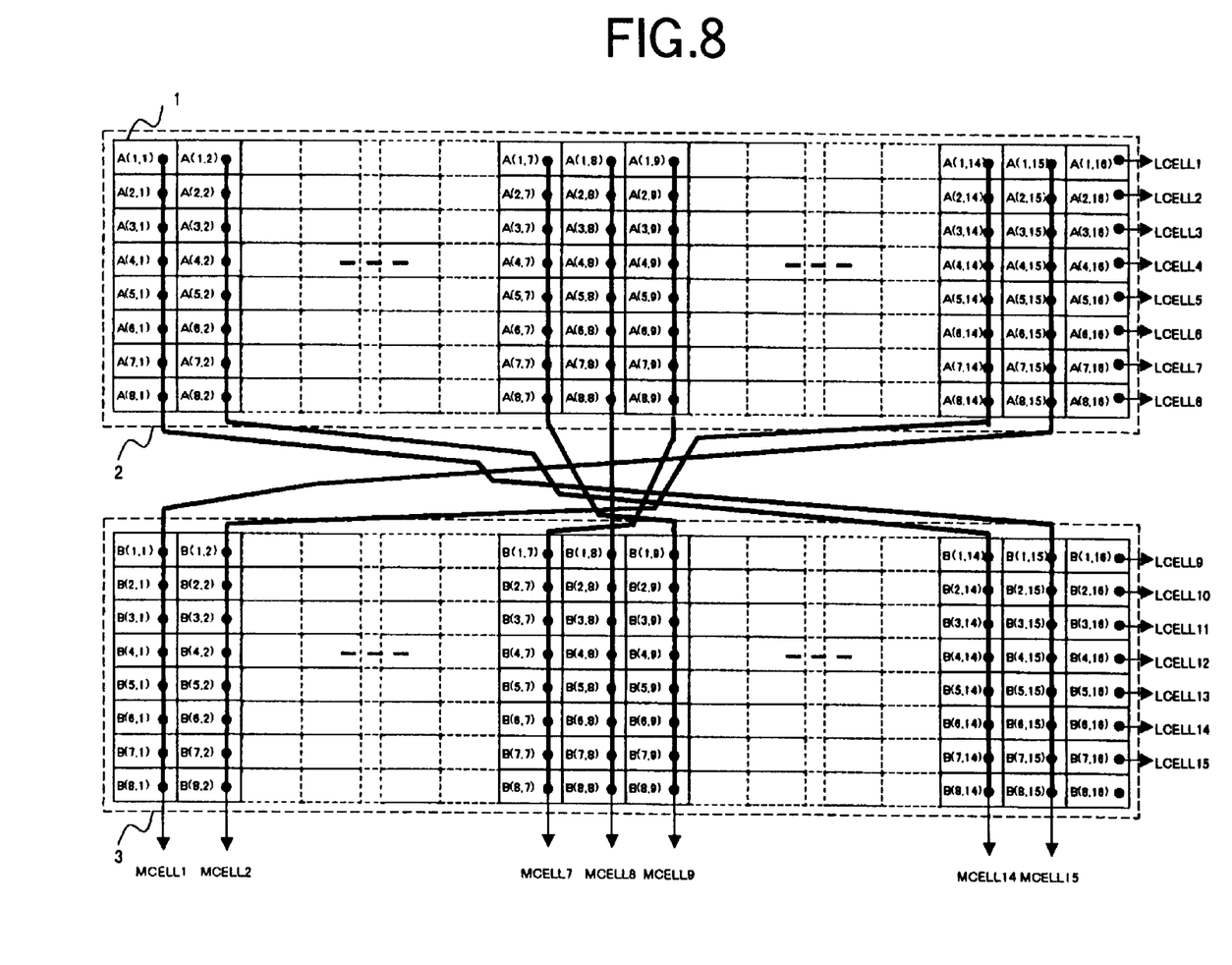
FIG. 8 is a diagram showing a current source cell arrangement according to the fourth embodiment of the invention.

FIG. 8 shows an arrangement of current source cells according to the fourth embodiment of the invention. In addition to representing the four higher order bits by arranging the current sources according to the first embodiment shown in FIG. 1, the fourth embodiment also has current source cells to represent four lower order bits.

While the first embodiment uses two 8-row-by-15-column blocks, the fourth embodiment uses two 8-row-by-16 column blocks to form an entire current source cell matrix. First to 15th columns in each of the A- and B-block are arranged in the same way as in the first embodiment, and each of the MSB units is formed by connecting 16 current source cells.

Here, A(1, 16)–A(8, 16) and B(1, 16)–B(8, 16) in the two blocks are used as LSB cells. In the LSB cells, connecting eight current source cells, which is half the number of the current source cells making up the MSB cell unit, represents ½ of the MSB cell. Similarly, connecting four current source cells represents ¼ of the MSB cell, connecting two current source cells represents ⅛ of the MSB cell, and connecting one current source cell represents 1/16 of the MSB cell.

In the fourth embodiment, by connecting the decoder that converts 4 bits into a decimal number and a switch and by using 15 LSB cells or current source cells, it is possible to form 4 bits of MSB×½, MSB×¼, MSB×⅛ and MSB×1/16 in addition to the 4 bits formed by MSB cells. This current source cell arrangement can increase the number of bits while suppressing an increase in the number of current source cells.

As described above, in the fourth embodiment a plurality of LSB cells each made up of at least one current source cell having the same or different current values are additionally provided. Application of this configuration to the D/A converter can improve its resolution. That is, it is possible to realize an excellent current source cell arrangement that can increase the number of bits while keeping the number of current source cells from increasing.

While the LSB cells are arranged on the right side of the current source cell matrix, they may be placed at the left side or the center or at the left and right side of the current source cell matrix. They may also be placed above or below the current source cell matrix. Further, when this arrangement is applied to the third embodiment, the LSB cells may be put in the central 4-row-by-4-column E-block. The LSB cells may be distributed at various locations, rather than at one location. Although the same current source cells are used, the current values of the individual current source cells may not be the same.

Embodiment 5

Figure 9:
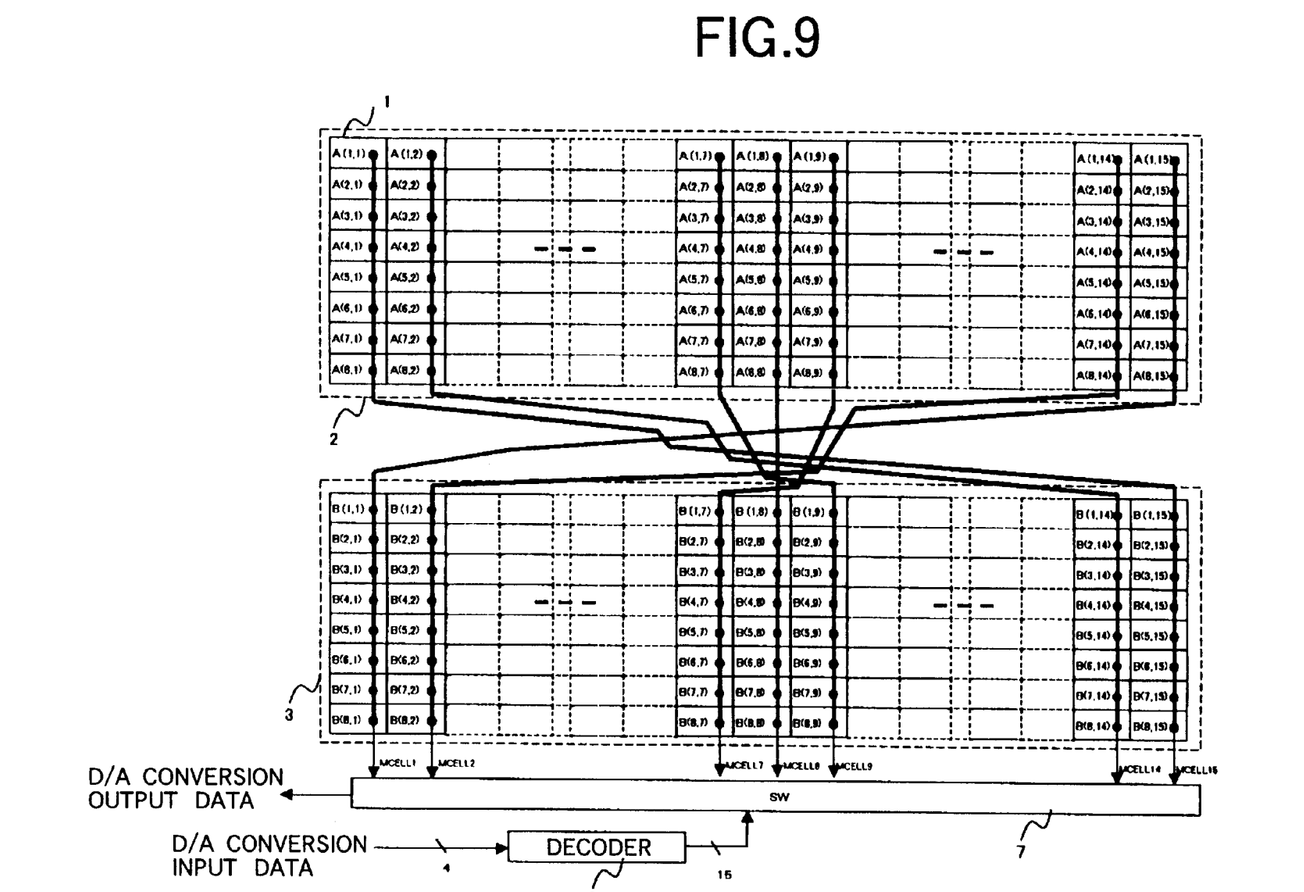
FIG. 9 is a diagram showing the construction of a D/A converter having a current source cell arrangement according to the fifth embodiment of the invention.

FIG. 9 shows the configuration of a current addition type D/A converter having a current source cell arrangement according to the fifth embodiment. In FIG. 9, an entire current source cell matrix comprises two 8-row-by-15-column blocks. Connecting outputs MCELL1–MCELL15 of the MSB cells to a switch (SW) 7 and controlling the switch 7 with a decoder 8 that converts D/A conversion input data (digital data) into a 15-value binary output can output the current of the MSB cells selected by the switch 7 as the D/A-converted output data (analog data).

By using the current source cell matrix having a linearity for the current source of the current addition type D/A converter, the characteristic degradation due to process variations can be minimized, improving the differential non-linearity error characteristic of the D/A converter that may deteriorate due to performance variations among individual current source cells. Thus, a highly accurate D/A converter can be obtained.

While in the fifth embodiment a 4-bit D/A converter has been explained, the number of bits may be set arbitrarily as by increasing the number of current source cells and adding SLB cells. Although a single switch (SW) is used in the embodiment, two switches may be used and operated complementarily to easily invert the D/A-converted output. Further, although the switch is provided in one direction only, another switch may be provided in the upper part of the diagram and the outputs of these switches be added up.

With this invention, if there are performance variations among the current source cells due to the LSI manufacturing process, a constant current source that cancels the variations and outputs a constant current value can be obtained. Hence, by applying this constant current source to the current addition type D/A converter, it is possible to prevent the differential non-linearity (DNL) error and integral non-linearity (INL) error, both representing linearity characteristics, from deteriorating. This in turn provides a highly accurate D/A conversion performance.

What is claimed is:

1. A current source cell arrangement comprising:
   a plurality of current source cells each having a predetermined current value, the current source cells being arranged in matrix,
   wherein two or more of the current source cells in the current source cell matrix are combined to form constant current sources each having a predetermined current value,
   wherein the current source cell matrix is divided into a plurality of blocks arranged symmetrically with respect to a center of the matrix,
   wherein the constant current sources are formed by combining equal numbers of the current source cells selected in a row or column direction from each block.

2. A current source cell arrangement according to claim 1, wherein the current source cell matrix is divided point-symmetrically with respect to a center of the matrix.

3. A current source cell arrangement according to claim 1, wherein the current source cell matrix is divided line-symmetrically with respect to a center of the matrix.

4. A current source cell arrangement according to claim 1, wherein the current source cell matrix is divided radially with respect to a center of the matrix.

5. A current source cell selection method for forming constant current sources each having a predetermined current value by combining two or more of a plurality of current source cells, wherein the plurality of the current source cells each having a predetermined current value are arranged in matrix, the current source cell selection method comprising steps of:

dividing the current source cell matrix into a plurality of blocks arranged symmetrically with respect to a center of the matrix;

selecting an equal number of the current source cells in a row or column direction from each of the divided blocks; and combining the selected current source cells to form the constant current sources.

6. A current source cell selection method according to claim 5, wherein the current source cell matrix is divided point-symmetrically with respect to a center of the matrix.

7. A current source cell selection method according to claim 5, wherein the current source cell matrix is divided line-symmetrically with respect to a center of the matrix.

8. A current source cell selection method according to claim 5, wherein the current source cell matrix is divided radially with respect to a center of the matrix.

9. A current addition type D/A converter comprising:

a current source cell matrix based on the current source cell arrangement having a plurality of current source cells each having a predetermined current value, the current source cells being arranged in matrix, wherein two or more of the current source cells in the current source cell matrix are combined to form constant current sources each having a predetermined current value, wherein the current source cell matrix is divided into a plurality of blocks arranged symmetrically with respect to a center of the matrix, wherein the constant current sources are formed by combining equal numbers of the current source cells selected in a row or column direction from each block, wherein the constant current sources constitute MSB units representing higher order bits of a digital input, and current values of a plurality of the constant current sources selected according to a decoded value of the digital input are added up to produce an analog output.

10. A current addition type D/A converter according to claim 9, wherein LSB units representing lower order bits of the digital inputs are each formed of at least one of the current source cells.

11. A current addition type D/A converter comprising:

a current source cell matrix based on the current source cell selection method having steps of dividing the current source cell matrix into a plurality of blocks arranged symmetrically with respect to a center of the matrix, selecting an equal number of the current source cells in a row or column direction from each of the divided blocks; and combining the selected current source cells to form the constant current sources, wherein the constant current sources constitute MSB units representing higher order bits of a digital input, and current values of a plurality of the constant current sources selected according to a decoded value of the digital input are added up to produce an analog output.

12. A current addition type D/A converter according to claim 11, wherein LSB units representing lower order bits of the digital inputs are each formed of at least one of the current source cells.

* * * * *